United States Patent [19]
Liu et al.

[11] Patent Number: 5,966,619
[45] Date of Patent: Oct. 12, 1999

[54] PROCESS FOR FORMING A SEMICONDUCTOR DEVICE HAVING A CONDUCTIVE MEMBER THAT PROTECTS FIELD ISOLATION DURING ETCHING

[75] Inventors: Wei-Hua Liu; David Burnett; Craig Swift, all of Austin, Tex.

[73] Assignee: Motorola, Inc., Schaumburg, Ill.

[21] Appl. No.: 08/772,740

[22] Filed: Dec. 23, 1996

[51] Int. Cl.[6] ............... H01L 21/28; H01L 21/70; H01L 21/8244
[52] U.S. Cl. ............... 438/453; 438/297; 438/647; 438/649; 438/664; 438/682
[58] Field of Search ............... 438/297, 453, 438/647, 649, 664, 682

[56] References Cited

U.S. PATENT DOCUMENTS

| | | | |
|---|---|---|---|
| 4,927,780 | 5/1990 | Roth et al. | 437/69 |
| 5,397,729 | 3/1995 | Kayanuma et al. | 438/453 |
| 5,624,871 | 4/1997 | Teo et al. | 438/453 |
| 5,635,426 | 6/1997 | Hayashi et al. | 438/453 |
| 5,712,183 | 1/1998 | Yu | 438/453 |

OTHER PUBLICATIONS

Katsuhiro Shimohigashi, et al., "An n–Well CMOS Dynamic RAM", Apr. 1982 IEEE, vol. ED–29, No. 4 pp. 714–718.

*Primary Examiner*—Charles Bowers
*Assistant Examiner*—David S Blum
*Attorney, Agent, or Firm*—George R. Meyer

[57] ABSTRACT

A semiconductor device (150) is formed having a first conductive member (64) overlying a field isolation region (36) that is typically less than two microns wide. Typically, the field isolation region (36) is relatively thinner compared to wider field isolation regions. The first conductive member (64) lies between the field isolation region (36) and a second conductive member (80) to shield the substrate (20). The shielding helps to increase the field threshold voltage of the field device. The invention is particularly useful in double polysilicon process flow used in forming devices operating at a potential higher than $V_{DD}$. Examples of these devices include nonvolatile memories and microcontrollers having nonvolatile memory arrays.

12 Claims, 4 Drawing Sheets

PROCESS FOR FORMING A SEMICONDUCTOR DEVICE HAVING A CONDUCTIVE MEMBER THAT PROTECTS FIELD ISOLATION DURING ETCHING

FIELD OF THE INVENTION

The present invention relates generally to semi conductor devices and processes for those devices, and more particularly, to semiconductor devices with narrow field isolation regions and process for forming those devices

BACKGROUND OF THE INVENTION

Semiconductor devices continue to be scaled to smaller and smaller dimensions. One of the problems caused by shrinking dimensions is field isolation thinning an small dimensional regions. More specifically, when the space between nitride features becomes less than two macrons the thickness of the field oxide grown an this small region can differ greatly from nitride grown in a large region. More specifically, for a spacing between nitride features of 2 macrons, a field oxide thickness of about 7500 angstroms would be achieved. However, for a spacing of 0.9 microns between nitride features, the same field oxide process would produce field oxide having a thickness of about 5900 angstroms. The locally thinner field isolation region combined with oxide removals can greatly decrease the thickness of the field of isolation region to less than half of what was originally grown. Using the previous example, only about 3000 angstroms of the original 5900 angstroms remains when a high potential electrode is formed on the field oxide.

A problem associated with this thinner field oxide is the creation of a field device that has an unacceptably low threshold voltage. This is particularly problematic when a gate electrode over the field isolation region is at a relatively high potential (higher than $V_{DD}$). When the gate electrode is at the relatively high potential, current can flow between the source/drain regions under the field isolation region, which is undesired.

Therefore, a need exists for forming a semiconductor device having reasonably high field threshold voltages. A need also exists that such a semiconductor device be formed without adding any processing steps or masking layers, so that processing time and costs are minimized.

BRIEF DESCRIPTION OF THE DRAWING

The present invention is illustrated by way of example and not limited in the accompanying figures, in which like references indicate similar elements, and in which.

Skilled artisans appreciate that elements in the figures are illustrated for simplicity and clarity and have not necessarily been drawn to scale. For example the dimensions of some of the elements in the figures are exaggerated relative to other elements to help to improve understanding of embodiment(s) of the present invention.

DETAILED DESCRIPTION

A semiconductor device is formed having a first conductive member overlying a field isolation region having a width that is typically less than one micron. Typically, the field isolation region is relatively thinner compared to the field isolation region thickness of a wader field isolation region. The first conductive member lies therebetween the field isolation region and a second conductive member to shield the substrate. The shielding helps to increase the field threshold voltage of the field device including the isolation region 36. The invention is particularly useful in a double polysilicon process flow used in forming devices operating at potentials higher than $V_{DD}$. Examples of these devices include nonvolatile memories and microcontrollers having nonvolatile memory arrays.

Figure 1:
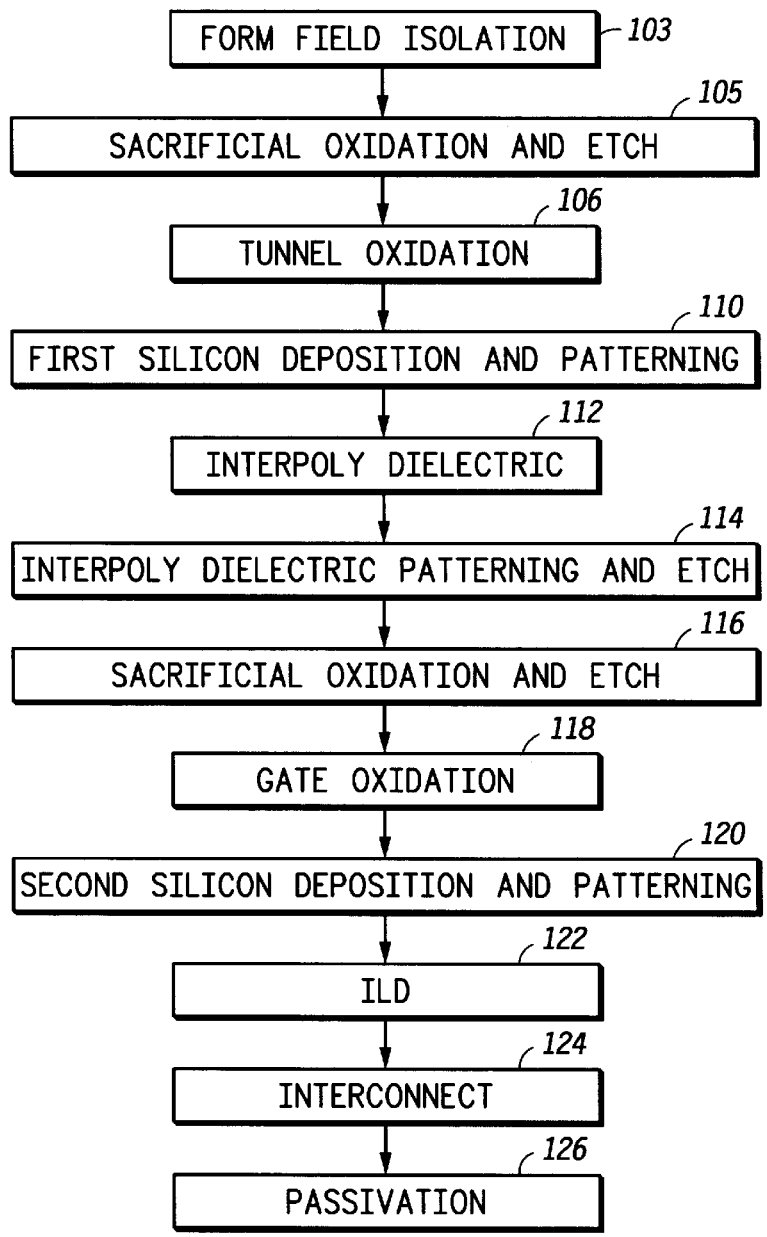
FIG. 1 includes a process flow diagram for forming a semiconductor device in accordance with one embodiment of the present invention.

FIG. 1 includes a process flow diagram for forming a semiconductor device an accordance with one embodiment of the present invention. The individual steps are described in more detail in FIGS. 2–10.

Figure 2:
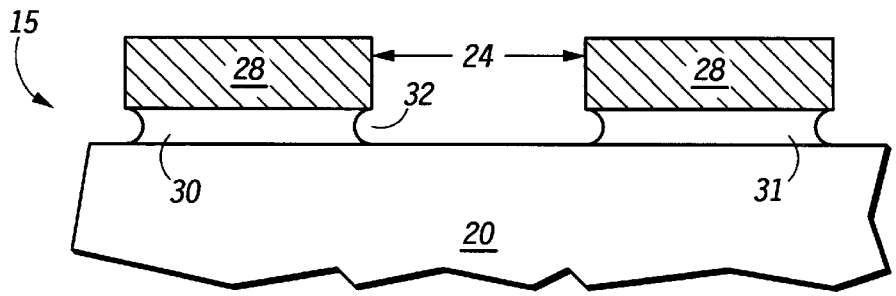
FIG. 2 includes an illustration of a cross-sectional view of a portion of a semiconductor substrate after partially undercutting beneath a silicon nitride layer.
Figure 3:
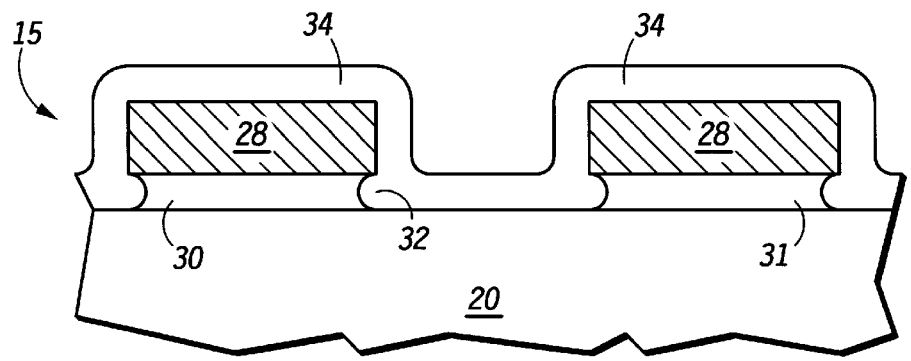
FIG. 3 includes an illustration of a cross-sectional view of the substrate of FIG. 2 after depositing a sacrificial silicon layer.

As illustrated in FIG. 2, a semiconductor device substrate 20 is covered by a pad oxide layer 30 and a silicon nitride layer 28. Semiconductor device substrate 20 includes a monocrystalline semiconductor wafer, a semiconductor-on-insulator substrate, or other substrates used in forming semiconductor devices. Layers 28 and 30 are patterned as illustrated in FIG. 2. The space 24 between the silicon nitride members 28 is approximately 0.9 microns. In other embodiments, the space 24 can vary anywhere from 1.0 micron down to 0.2 microns. Following the patterning step, a slight undercut 32 of the pad oxide layer remains due to isotropic etching. A deposited sacrificial silicon layer 34 is formed over the substrate 20 and the silicon nitride members 28. Because the deposited silicon layer 34 is conformal, it deposits within the undercut 39 as shown in FIG. 3.

Figure 4:
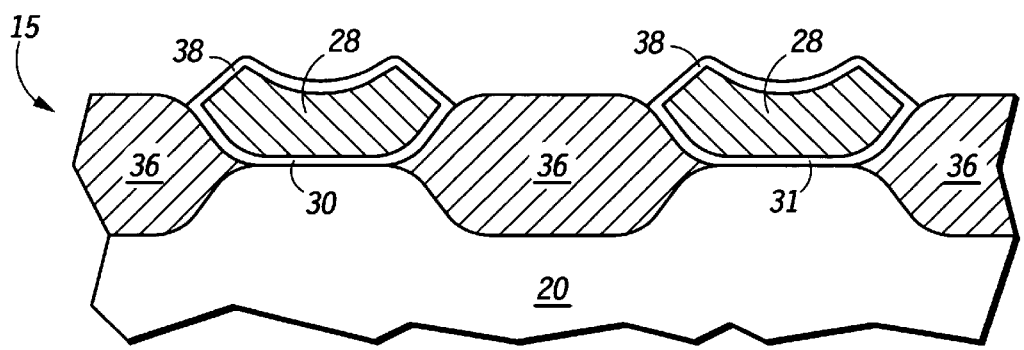
FIG. 4 includes an illustration of a cross-sectional view of the substrate of FIG. 3 after forming field isolation regions.

The substrate 20 is thermally oxidized to form field isolation regions 36 as shown in FIG. 4 (step 103 of FIG. 1). The deposited silicon layer 34 is converted to an oxide 38 during this step. In other portions of the substrate 20 (not shown) where the space between nitride members is more than two microns, the field oxide regions have a thickness of approximately 7500 angstroms. However, due to the smaller spacing 24 between nitride members 28 (approximately 0.9 microns), the field isolation regions 36 at their thickest point are only approximately 5900 angstroms.

Figure 5:
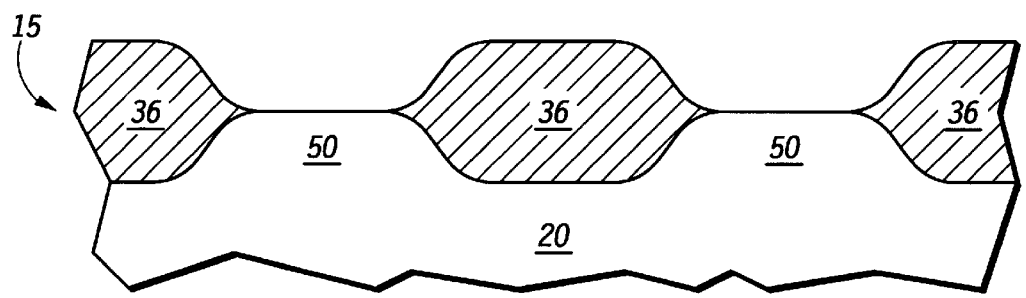
FIG. 5 includes an illustration of a cross-sectional view of the substrate of FIG. 4 after removing the silicon nitride members and oxide layers over active regions.
Figure 6:
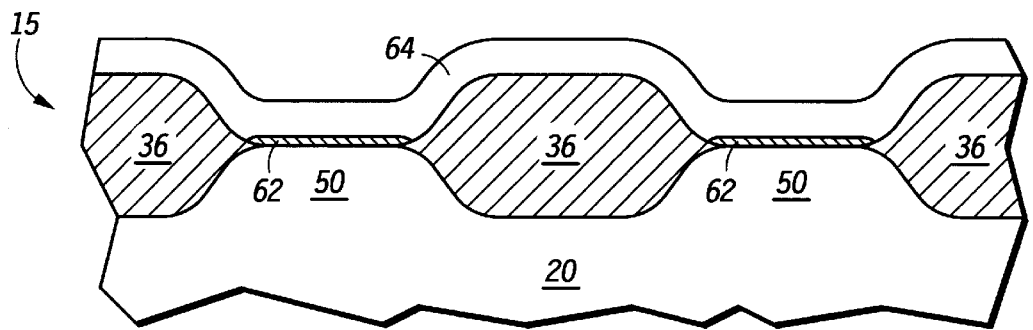
FIG. 6 includes an illustration of a cross-sectional view of the substrate of FIG. 5 after forming a first deposited silicon layer.

After forming field isolation regions 36, the silicon nitride members 28 and oxide layers 30 and 38 are removed to yield the structure as shown in FIG. 5. Active regions 50 are defined by the field isolation regions 36. Although not shown, a sacrificial oxidation step and etch are performed (step 105 of FIG. 1). During this step, portions of the field isolation regions 36 are etched and causes the field isolation regions 36 to pull back from the original edge of the active regions 50 of FIG. 6. A tunnel dielectric layer 62, which is a type of gate dielectric layer, is formed over the active regions 50 (step 106 in FIG. 1). The tunnel dielectric layer 62 includes silicon dioxide, a nitrided oxide, or the like. A first conductive layer 64 is deposited over the field isolation regions 36 and tunnel dielectric layer 62 as shown in FIG. 6. The first conductive layer typically includes silicon, such as amorphous silicon, polycrystalline silicon, and metal silicide.

Figure 7:
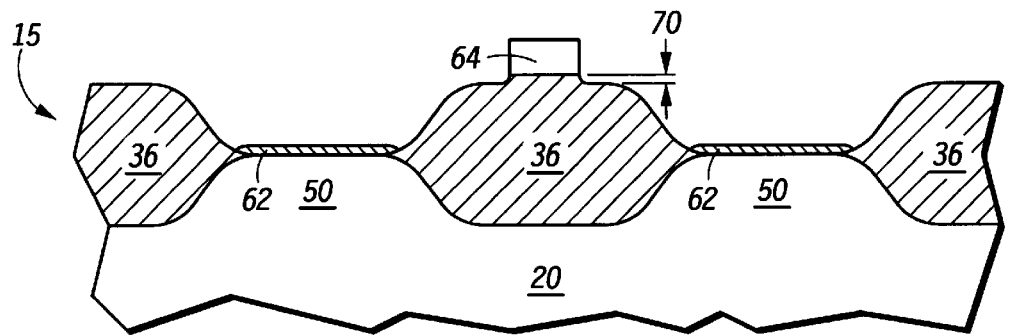
FIG. 7 includes an illustration of a cross-sectional view of the substrate of FIG. 6 after patterning the first deposited silicon layer.

The first conductive layer 64 is patterned to form the first conductive member 64 overlying a center portion of the field isolation region 36 as shown in FIG. 7 (step 110 in FIG. 1). The center portion of the field isolation region 36 includes a midpoint that is halfway between the active regions 50. At this point, the center portion of the field isolation region 36 is permanently covered by the first conductive member 64 to allow a thicker field isolation region to be formed compared to the prior art.

Next, an inter-electrode dielectric layer including oxide-nitride is formed (step 112 in FIG. 1, and patterned using dry etch methods or wet etching methods (step 114 in FIG. 1). A sacrificial oxide layer is then formed and etched to give the resulting structure as shown in FIG. 7 (step 116 in FIG. 1). Note that elevational difference 70 represents field isolation region 35 thickness that is saved using the present invention compared to prior art methods. In this embodiment, approximately 500 angstroms of additional field isolation is saved and increases the field threshold voltage of this particular structure. In the prior art, the first silicon member 64 is not formed, and therefore, the entire upper surface of the field isolation region 36 is exposed to the etchants.

Figure 9:
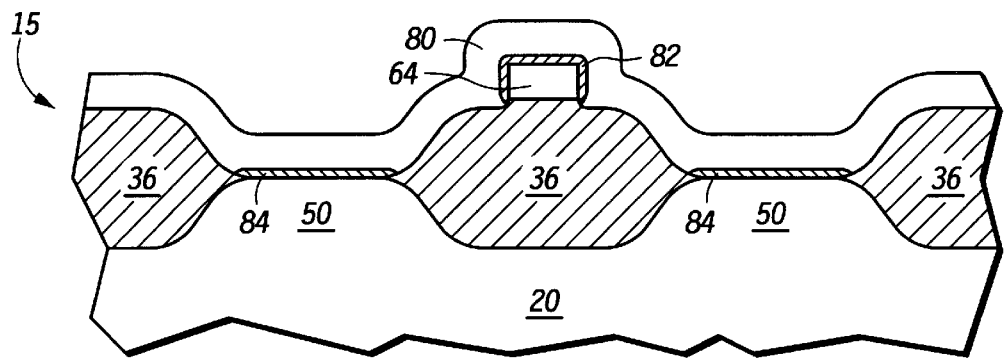
FIG. 9 includes an illustration of a cross-sectional view of the substrate of FIG. 7 taken through sectioning lines 9—9 as shown in FIG. 8.

A gate dielectric layer 84 is formed over the active regions 50 (step 118 of FIG. 1) as seen in FIG. 9. The step also oxidizes a portion of the nitride layer to form oxide-nitride-oxide (ONO) 82 over the first conductive member 64.

Figure 8:
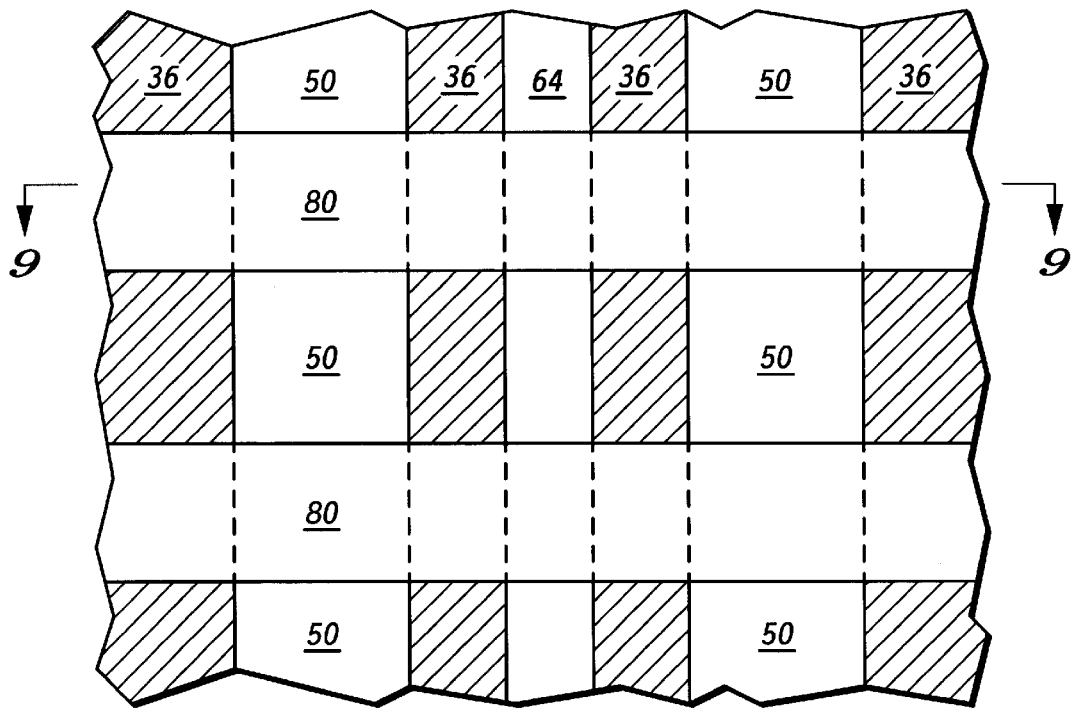
FIG. 8 includes a top view of the semiconductor device illustrating the positional relationships of the field isolation regions, first deposited silicon layer, second deposited silicon layer, and active regions.

A second conductive layer 80 is deposited and patterned to form the semiconductor device structures as shown in FIGS. 8 and 9 (step 120 of FIG. 1). FIG. 8 includes a top view that illustrates the positional relationships between the field isolation regions 36, active regions 50, first conductive member 64, and second conductive members 80. The first conductive member 64 only overlies the field isolation region 36, is spaced apart and does not overlie the active regions 50. The spacing between the edge of the first conductive member 64 and the edge of the field isolation region 36 should be sufficiently large enough to allow for some misalignment. Typically, this spacing should be at least approximately 0.1 micron, however, as photolithographic processes improve, it may be possible to reduce that spacing. FIG. 9 includes a cross-sectional view through the sectioning lines 9—9 in FIG. 8. Although not shown, a doping step is performed to form source/drain regions from portions of the active regions 50 that are not covered by the second conductive members 80. The source/drain regions typically have a conductivity type opposite that of the active regions 50.

Figure 10:
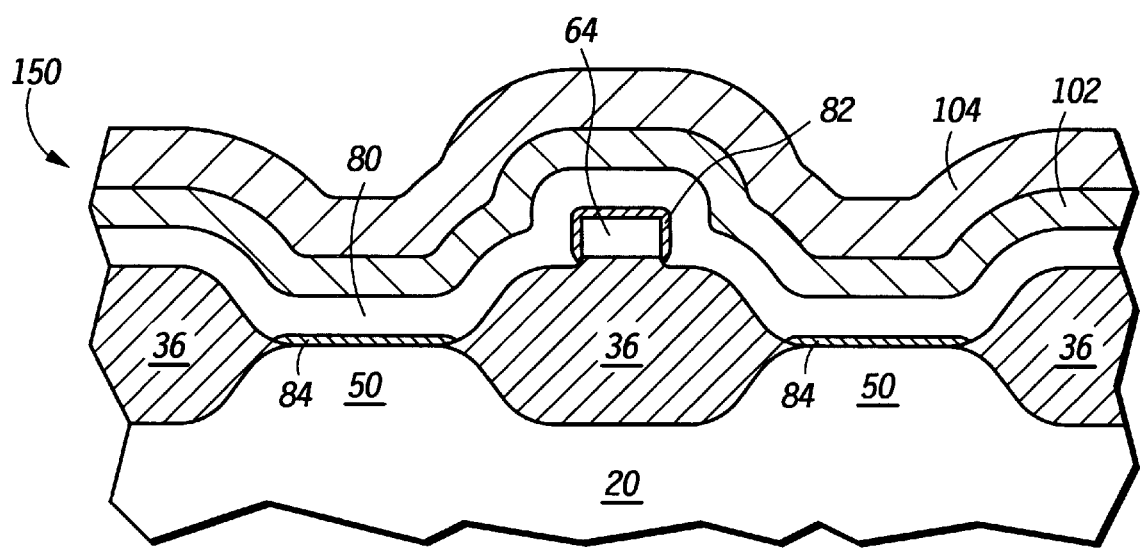
FIG. 10 includes an illustration of a cross-sectional view of the substrate of FIG. 9 after forming a substantially completed device.

Processing is continued to form a substantially completed semiconductor device 150 as illustrated in FIG. 10 that includes an interlayer dielectric (ILD) layer 102 and a passivation layer 104. In forming the semiconductor device, the interlevel dielectric layer 102 is typically deposited and patterned to form contact openings (step 122 of FIG. 1). The ILD layer 102 includes an oxide, nitride, or oxynitride and may be doped or undoped. The ILD layer 102 can be formed with or without plasma assistance.

Interconnects are formed within the contact openings (step 124 in FIG. 1). Although interconnects are not shown in FIG. 10, the second conductive layer is electrically coupled to a potential that has an absolute value higher than $V_{DD}$, such as $V_{PP}$. For example, $V_{DD}$ for the semiconductor device 150 is approximately 3.3 volts, and the second conductive member 80 has a potential of approximately 7.0 volts for at least a time period when the semiconductor device 150 is operating. The first conductive member 64 is electrically connected to the second conductive member 80 or a voltage reference terminal that provides a substantially constant potential source, such as $V_{SS}$, $V_{DD}$, $V_{PP}$, or the like, but is not shown in FIG. 10. In one embodiment, if the active regions 50 are N-type, the first conductive member 64 is electrically connected to a $V_{DD}$ terminal. In another embodiment, if the active regions 50 are P-type, the first conductive member 64 is electrically connected to a terminal having a potential less than $V_{SS}$. If the active regions 50 have different conductivity types, the first conductive member 64 is electrically connected to a $V_{SS}$ terminal in a preferred embodiment. In stall another embodiment, the first and second conductive members 54 and 30 are electrically connected to each other. However, if the first and second conductive members 64 and 80 are electrically connected, the first conductive member 64 needs to be disconnected between adjacent second conductive members 80 to reduce the likelihood of electrical shorting between adjacent rows or columns of second conductive members 80. On this embodiment, the additional thickness of the field isolation region 36 increases the threshold voltage of the field device by approximately three volts.

A passivation layer 104 is deposited over the interconnects (step 126 of FIG. 1) The passivation layer includes doped oxide, silicon nitride, silicon oxynitride or the like. The deposition can be performed with or without plasma assistance in other embodiments addition interlevel dielectric layers and interconnect levels could be used On forming the semiconductor device 150. In still other embodiments, the second deposited silicon layer can be electrically connected to the first polysilicon member.

In one embodiment of the invention, the first conductive member 64 acts as a shield between the second conductive member 80 and a portion of the substrate 20 directly below that first conductive member 64 as shown in FIG. 10. The shielding increases the field threshold voltage for the field device compared to prior art semiconductor devices because the prior art semiconductor devices do not typically have shielding between a field isolation region and the second conductive member that reaches a high potential (higher than $V_{DD}$). Although portions of the substrate 20 near the edges of the field isolation region 36 may invert, a portion of the substrate 20 directly beneath the first conductive member 64 is more resistant to inversion. Without continuous inversion, no significant electrical current flows beneath the field isolation region. Another benefit of the present invention is that the space between the active nitride members can be narrowed to a point that would otherwise be unacceptable using the prior art methods. As long as a portion of the substrate 20 underneath the field isolation region is not inverted, no significant electrical current flows beneath the field isolation region.

Another benefit of the present invention is that it can be used without adding any additional processing steps or masking layers to a standard nonvolatile memory process flows particularly one used in microcontrollers. Wafer yield of semiconductor devices 150 should improve because now that the field thresholds are higher. At worst, the wafer yield should not decrease because no additional processing steps or masking layers are used.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. On the claims, means-plus-function clause(s), if any, cover the structures described herein that perform the recited function(s). The mean-plus-function clause(s) also cover structural equivalents and equivalent structures that perform the recited function(s).

We claim:

1. A process for forming a semiconductor device comprising the steps of:
   forming a field isolation region on a semiconductor device substrate, wherein:
      the field isolation region lies between a first active region and a second active region; and
      the field isolation region includes a first portion and a second portion;
   forming a first dielectric layer over and directly contacting the first and second active regions;
   forming a first conductive member on the first portion of the field isolation region, wherein the first conductive member does not overlie the first and second active regions;
   removing the first dielectric layer and a part of the second portion of the field isolation region, wherein substantially none of the first portion of the field isolation region is removed during this step; and
   forming a second conductive member over the first conductive member and field isolation region, wherein the second conductive member is spaced apart and does not contact the first conductive member at any location over the field isolation region lying between the first and second active regions.

2. The process of claim 1, wherein the first and second conductive members comprise silicon.

3. The process of claim 1, wherein step of forming the second conductive member comprises the steps of:
   depositing a silicon-containing layer on the field isolation region, and
   patterning the silicon-containing layer to form the second conductive member.

4. The process of claim 1, wherein:
   the step of forming the field isolation region is performed such that the first portion includes a midpoint halfway between the first and second active regions, and
   the step of forming the first conductive member is performed such that the first conductive member overlies the midpoint.

5. The process of claim 1, further comprising a step of forming a passivation layer over the second conductive member.

6. A process for forming a semiconductor device comprising the steps of:
   forming a field isolation region on a semiconductor device substrate, wherein;
      the field isolation region lies between a first active region and a second active region; and
      the field isolation region includes a first portion and a second portion;
   forming a first dielectric layer over and directly contacting the semiconductor device substrate;
   forming a first conductive member over the first portion of the field isolation region;
   removing the first dielectric layer and a part of the second portion of the field isolation region, wherein the first conductive member overlies the first portion of the field isolation region and substantially none of the first portion is removed during this step;
   forming a second dielectric layer over and directly contacting the first and second active regions and a portion of the first conductive member;
   forming a second conductive member over and dirctly contacting the second dielectric layer over the portion of the first conductive member; and
   forming a first electrical connection that is electrically connected to the first conductive member, wherein the first electrical connection is made to the second conductive member or a voltage reference terminal.

7. The process of claim 6, further comprising a step of forming an interelectrode dielectric layer between the steps of forming the first conductive member and forming the second conductive member.

8. The process of claim 6, wherein
   the first active region and the second active region are N-type active regions, and
   the voltage reference terminal is capable of providing a potential greater than Vss.

9. The process of claim 6, wherein:
   the firs active region and the second active region are P-type active regions; and
   the voltage reference terminal is capable of providing a potential less than Vss.

10. The process of claim 6, wherein the first and second conductive members comprise silicon.

11. The process of claim 6, wherein the step of forming the second conductive member comprises the steps of:
   depositing a silicon-containing layer on the field isolation region; and
   patterning the silicon-containing layer to form the second conductive member.

12. The process of claim 6, further comprising a step of forming a passivation layer over the second conductive member.

* * * * *